(12) United States Patent
Schreiber et al.

(10) Patent No.: US 11,610,627 B2
(45) Date of Patent: Mar. 21, 2023

(54) WRITE MASKED LATCH BIT CELL

(71) Applicant: Advanced Micro Devices, Inc., Santa Clara, CA (US)

(72) Inventors: Russell J. Schreiber, Austin, TX (US); John J. Wuu, Ft. Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/359,254

(22) Filed: Jun. 25, 2021

(65) Prior Publication Data

US 2022/0358996 A1     Nov. 10, 2022

Related U.S. Application Data

(60) Provisional application No. 63/185,207, filed on May 6, 2021.

(51) Int. Cl.
| | | |
|---|---|---|
| *G11C 7/10* | (2006.01) | |
| *G11C 11/4096* | (2006.01) | |
| *G11C 11/408* | (2006.01) | |
| *G11C 11/4074* | (2006.01) | |

(52) U.S. Cl.
CPC ........ *G11C 11/4096* (2013.01); *G11C 7/1009* (2013.01); *G11C 7/1087* (2013.01); *G11C 11/4074* (2013.01); *G11C 11/4085* (2013.01)

(58) Field of Classification Search
CPC . G11C 11/4096; G11C 7/1009; G11C 7/1087; G11C 11/4074; G11C 11/4085
USPC ............................................. 365/189.05, 154
See application file for complete search history.

(56) References Cited

U.S. PATENT DOCUMENTS

| | | |
|---|---|---|
| 5,752,045 A | 5/1998 | Chen |
| 5,828,612 A | 10/1998 | Yu |
| 9,928,889 B1 | 3/2018 | Narasimhan |
| 10,043,572 B1 | 8/2018 | Schreiber et al. |
| 10,147,483 B1 | 12/2018 | Mohanty et al. |
| 10,332,570 B1 | 6/2019 | Ahmed |
| 10,395,700 B1 | 8/2019 | Bringivijayaraghavan |
| 10,438,636 B2 | 10/2019 | Ahmed et al. |
| 10,541,013 B1 | 1/2020 | Schreiber et al. |
| 10,790,013 B1 | 9/2020 | Dubey et al. |

(Continued)

FOREIGN PATENT DOCUMENTS

| | | |
|---|---|---|
| KR | 10-2013-0033230 | 4/2013 |
| KR | 10-2015-0068477 A | 6/2015 |
| KR | 10-2016-0042083 | 4/2016 |

OTHER PUBLICATIONS

International Search Report and Written Opinion dated Aug. 12, 2022, in Application No. PCT/US2022/027789, 12 pages.

*Primary Examiner* — Huan Hoang
(74) *Attorney, Agent, or Firm* — Zagorin Cave LLP

(57) ABSTRACT

A write masked latch bit cell of an SRAM includes a write mask circuit that is responsive to assertion of a first write mask signal to cause a value of a write data node to be a first value and is responsive to assertion of a second write mask signal to cause the value of the write data node to have a second value. A pass gate supplies the data on the write data node to an internal node of the bit cell responsive to write word line signals being asserted. A keeper circuit maintains the value of the first node independently of values of the write word line signals while the first write mask signal and the second write mask signal are deasserted.

20 Claims, 12 Drawing Sheets

(56) References Cited

U.S. PATENT DOCUMENTS

| | | |
|---|---|---|
| 11,183,234 B2 | 11/2021 | Fujiwara et al. |
| 11,257,825 B1 | 2/2022 | Xian et al. |
| 2005/0152199 A1* | 7/2005 | Park .................. G11C 7/18 |
| | | 365/222 |
| 2005/0265096 A1 | 12/2005 | Obara et al. |
| 2006/0092711 A1 | 5/2006 | Kant et al. |
| 2006/0274002 A1 | 12/2006 | Guttag |
| 2009/0146689 A1 | 6/2009 | Chandler |
| 2010/0091585 A1 | 4/2010 | Wang |
| 2012/0155151 A1* | 6/2012 | Rachamadugu ...... G11C 11/412 |
| | | 365/154 |
| 2014/0269091 A1 | 9/2014 | Zheng |
| 2015/0109865 A1 | 1/2015 | Gulati |
| 2016/0217835 A1 | 7/2016 | Blott et al. |
| 2018/0157488 A1 | 6/2018 | Shu |
| 2018/0240520 A1 | 8/2018 | Best |
| 2019/0139600 A1 | 5/2019 | Wu et al. |
| 2020/0388329 A1 | 12/2020 | Choserot |
| 2021/0124701 A1 | 4/2021 | Lee et al. |

* cited by examiner

| PPG | PFB0 | PFB1 | PINV | DUM | PRP1 | PRP0 |
|-----|------|------|------|-----|------|------|
| WD | D | | VDD | D_X | VDD | RD |
| WD | D | | VSS | D_X | VSS | RD |
| NPG | NFB0 | NFB1 | NINV | DUM | NRP1 | NRP0 |

| DUM | PFB2 | PWD | PPG | PFB0 | PFB1 | PINV | DUM | PRP1 | PRP0 |
|---|---|---|---|---|---|---|---|---|---|
| PKSTK | VDD | WD | D | PKSTK | VDD | D_X | VDD |  | RD |
| NKSTK | VSS | WD | D | NKSTK | VSS | D_X | VSS |  | RD |
| DUM | NFB2 | NWD | NPG | NFB0 | NFB1 | NINV | DUM | NRP1 | NRP0 |

FIG. 7

|      | PWD | PPG | PFB0 |      | PINV | DUM | PRP1 | PRP0 |
|------|-----|-----|------|------|------|-----|------|------|
| VDD  | WD  | D   |      | VDD  | D_X  | VDD |      | RD   |
| VSS  | WD  | D   |      | VSS  | D_X  | VSS |      | RD   |
|      | NWD | NPG | NFB0 | NFB1 | NINV | DUM | NRP1 | NRP0 |

FIG. 10

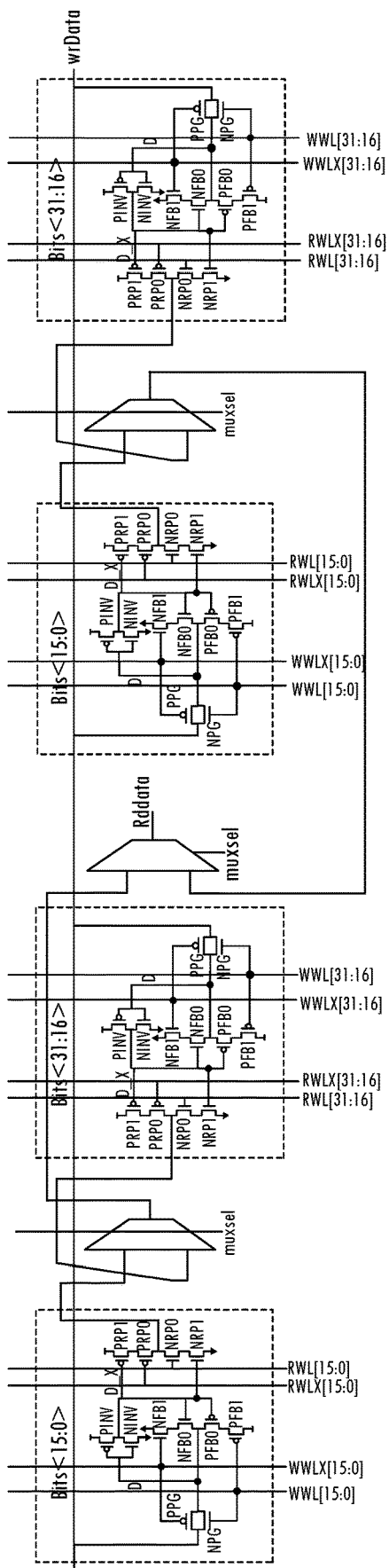
FIG. 11
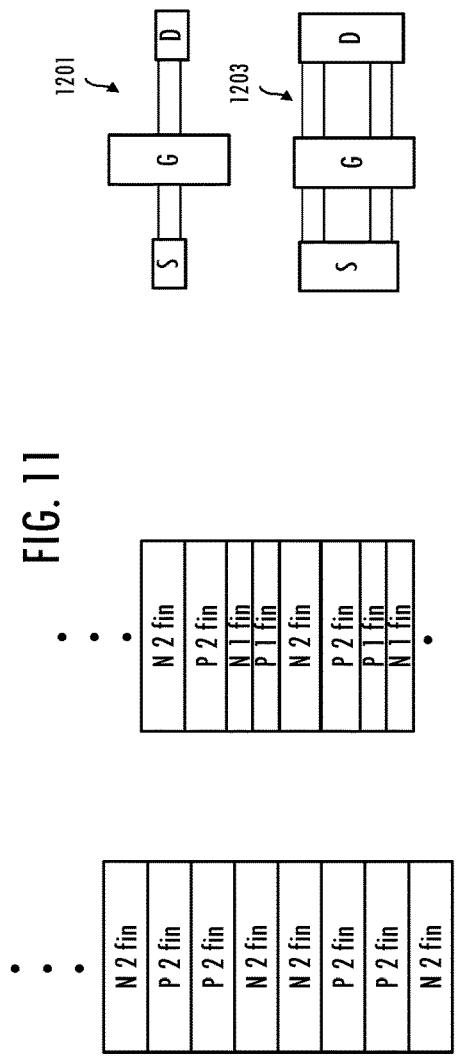
FIG. 12C
FIG. 12B
FIG. 12A

WRITE MASKED LATCH BIT CELL

CROSS-REFERENCE TO RELATED APPLICATION(S)

This application claims benefit of provisional application 63/185,207 filed May 6, 2021, entitled "Latch Bit Cell, Write Masked Latch Bit Cell, and Hybrid Library Latch Array", naming Russell J. Schreiber and John J. Wuu as inventors, which application is incorporated herein by reference.

BACKGROUND

Description of the Related Art

This application relates to SRAMs and SRAM bit cells. Selectively writing bit cells in SRAMS allows more efficient overall operation of the SRAM. It would be desirable to continue to improve area impacts of masked writes to SRAM cells to help provide improved system performance.

SUMMARY OF EMBODIMENTS OF THE INVENTION

Accordingly, in one embodiment apparatus includes a write masked latch bit cell that includes a write portion. The write portion includes a write mask circuit responsive to assertion of a first write mask signal to cause a value of a write data node to be a first value and responsive to assertion of a second write mask signal to cause the value of the write data node to have a second value. A pass gate is coupled to the write data node and supplies the value of the write data node to a first node responsive to write word line signals being asserted. A keeper circuit is configured to maintain the value of the first node independently of values of the write word line signals while the first write mask signal and the second write mask signal are deasserted.

In another embodiment a method includes setting a write data node in a write masked latch bit cell to a first value responsive to assertion of a first write mask signal and setting the write data node to a second value responsive to assertion of a second write mask signal. The method includes coupling the write data node to a first node responsive to write word line signals being asserted. The data on the first node is maintained by a keeper circuit independently of values of the write word line signals while the first write mask signal and the second write mask signal are deasserted.

In another embodiment a method includes writing a write masked latch bit cell responsive to a write word line (WWL) signal and an active low write word line (WWLX) signal being asserted in combination with either a first write mask signal or a second write mask signal being asserted. A state of the write masked latch bit cell is maintained while the WWL signal and WWLX signal are asserted and the first write mask signal and the second write mask signal are deasserted.

BRIEF DESCRIPTION OF THE DRAWINGS

The present invention may be better understood, and its numerous objects, features, and advantages made apparent to those skilled in the art by referencing the accompanying drawings.

FIG. 7 illustrates a layout of the write masked latch bit cell.

FIG. 10 illustrates a layout of the write masked latch bit cell of FIG. 8.

FIG. 11 illustrates an embodiment of a column formed by the latch bit cells of FIG. 1.

FIG. 12A illustrates a traditional standard cell architecture with two fins per transistor finger.

FIG. 12B illustrates a hybrid standard cell architecture with alternating cells of two fins per transistor finger and one fin per transistor finger.

FIG. 12C illustrates a high level block diagram of finfets with one fin per transistor finger and two fins per transistor finger.

The use of the same reference symbols in different drawings indicates similar or identical items.

DETAILED DESCRIPTION

Figures 1, 2:
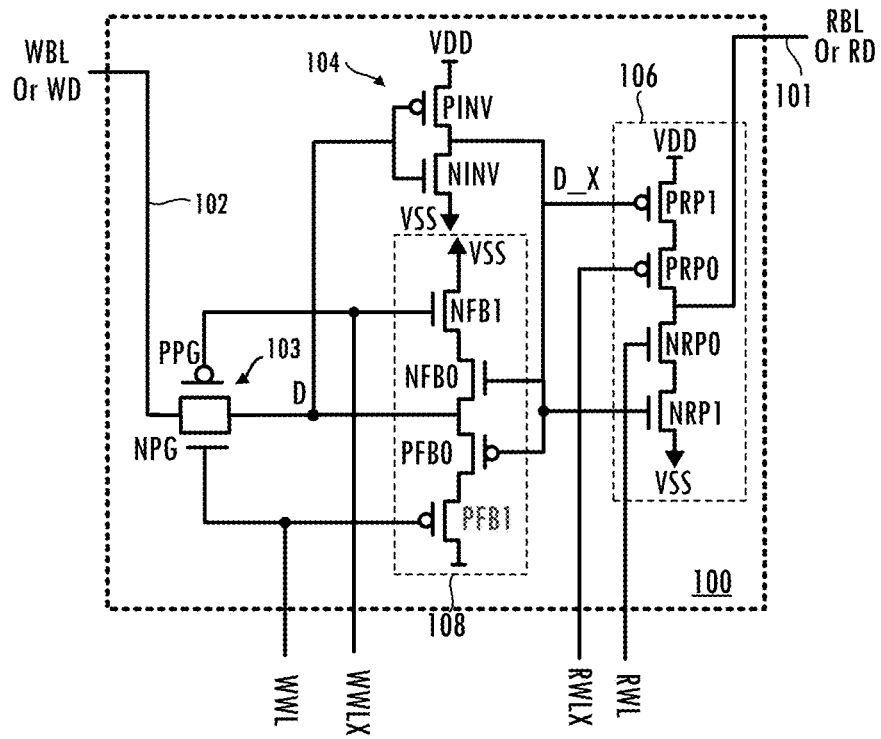
FIG. 1 illustrates an embodiment of a latch bit cell according to an embodiment.
FIG. 2 illustrates an example layout of the latch bit cell.

Eight transistor (8T) static random access memory (SRAM) arrays are not scaling well in terms of area in newer technology nodes. However, circuits built with standard cell design rules continue to scale relatively well in newer technology nodes. Building SRAM arrays with standard cell design rules allows a smaller area to be used even though there are more transistors. FIG. 1 illustrates an SRAM bit cell implemented as a latch bit cell 100 with separate read and write ports. Note that the latch bit cell 100 uses 12 transistors per bit as compared to the 8 transistors of an 8T SRAM bit cell but still uses less area in certain manufacturing technologies due to use of the standard cell design rules. A significant difference between a latch type bit cell and classic 6T/8T SRAM bit cells is the latch bit cell disables the feedback during writes. In contrast in 6T/8T bit cells, the pass gate has to fight the pullup to perform the write. The latch bit cell does not have such contention during writes.

The approach of FIG. 1 implemented using standard cell design rules means the overhead required for the use of custom SRAM macros disappears thereby reducing area. For example, the use of standard cell layout rules allows 0 connected poly pitch (CPP) (distance in horizontal direction between transistors) abutment into standard cell logic. More traditional approaches to SRAMs have boundary cells and edge cells needed for lithographic purposes. Since standard cell design rules scale well, implementing SRAM cells based on the latch bit cell 100 and standard cell design rules allows SRAM designs to scale in area similarly to standard architectures in the future.

The latch bit cell illustrated in FIG. 1 amortizes local inverters usually present in latches across many more cells. The latch bit cell illustrated in FIG. 1 removes local inverters that would traditionally be used on inputs into the latch including the write bit line (WBL), write word line (WWL), the active low write word line (WWLX), read word line (RWL), and the active low read word line (RWLX). In more traditional arrays of latches, CMOS combining stages are used between latches. The latch bit cell 100 uses a tristate output for RBL 101. The use of a tristate driver by the latch bit cell allows the output (read bit lines) of several cells, e.g., 16, to be combined together using tristate output drivers to avoid any additional combining stages (such as NOR/NANDing) of the output data.

FIG. 2 illustrates a stick layout of the latch bit cell 100 showing 7 transistors in a horizontal direction. The boxes show the source/drain connections for the transistors. The gate regions of the transistors are shown as vertical lines with the same label as the transistors in FIG. 1. The long vertical lines 201 indicate a shared gate connection, e.g., by transistors PFB0 and NFB0 and transistors PINV and NINV. Where there is a blank in the box, there is a node that is not named in FIG. 1 but any unidentified source/drain connections as well as gate connections can be readily seen in FIG. 1. The layout includes a dummy cell (DUM) transistor. A dummy is a transistor that is formed but not connected. The use of the dummy transistor provides an efficient way to provide isolation between other transistors. The use of the dummy transistor also provides an advantage in the ability to change the type of transistors used in terms of threshold voltage (Vt). In embodiments, the write portion of the latch (transistors PPG, NPG, PINV, NINV, NFB1, NFB0, PFB0 and PFB1) does not need high performance but the read portion of the latch (transistors PRP1, PRP0, NRP0, and NRP1) does need high performance. Note that the first letter of the transistor name refers to the type of transistor (N or P) and the remaining letters refer to its function (PG—pass gate, INV—inverter, FB—feedback, RP-read port)

Figure 3:
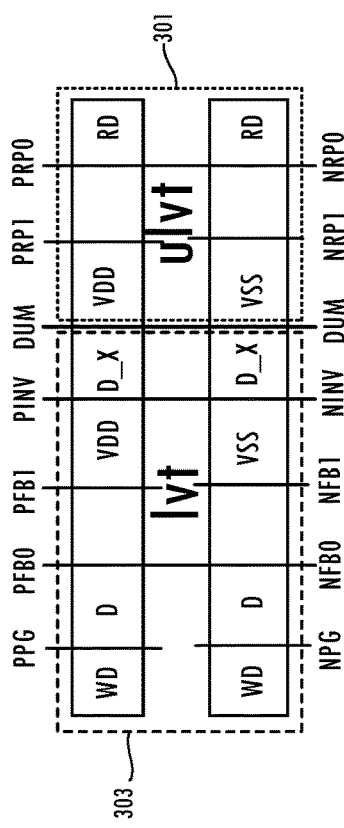
FIG. 3 illustrates how different threshold voltages may be used in read and write portions of the latch bit cell.

With reference to FIG. 3, that allows the read portion 301 of the latch bit cell 100 including transistors PRP0, PRP1, NRP0, and NRP1 to be implemented using lower Vt (such as ultra low Vt (ulvt)) transistors thereby providing the required high performance, while the write portion 303 of the latch bit cell 100 on the left side of the dummy transistor in FIG. 3 are implemented with higher threshold voltage transistors (such as low Vt (lvt)) transistors). The higher Vt transistors provide lower performance but also less leakage and the lower Vt transistors are utilized only where needed for performance. Thus, the layout options allow different threshold voltages to be utilized on the read port and the write port, which have different performance requirements, thereby allowing leakage current to be reduced as compared to having to use lower Vt devices for all devices to meet performance requirements for only a portion of the bit cell. Transistors in the read port and write port share diffusion between neighboring cells where possible cutting in half the xtor (transistor) load over an unoptimized design.

Referring back to FIG. 1, the operation of the latch bit cell 100 will now be described. The data to be written to the cell on the write bit line WBL 102 (also referred to herein as write data (WD) is supplied to the pass gate 103 formed of transistors NPG and PPG. The gates of those transistors are coupled respectively to write word line (WWL) and write word line X (WWLX), where "X" represents the signal is active low. When WWL and WWLX are asserted, the data on WBL is passed as data "D" into the inverter 104 formed by the transistors PINV and NINV. The transistors NFB1 and PFB1 are turned off when WWL and WWLX are asserted. The gates of NFB0 and PFB0 in the feedback portion of the bit latch cell 100 receive the output D_X (the inverted value of "D") from the inverter. The gates of PRP1 and NRP1 in the read portion 106 of the latch also receive D_X. When WWL and WWLX deassert, the pass gate 103 shuts off and the transistors NFB1 and PFB1 turn on allowing D_X to turn on one of the transistors NFB0 or PFB0 to supply "D" as a feedback signal. The transistors NFB1, NFB0, PFB0, and PFB1 function as a keeper circuit 108, and along with the inverter formed by transistors PINV and NINV, ensure that the data on node D is maintained when WWL and WWLX are deasserted. In that way, the value of D is maintained in the write portion of the latch bit cell 100 and available when the latch is read. In the latch bit cell 100, the PMOS transistors PINV, PFB1, and PRP1 are coupled to a supply voltage (VDD) at their sources. The NMOS transistors NINV, NFB1, and NRP1 are coupled to a second supply voltage (ground) at their sources.

In order to read the latch bit cell, the read word line (RWL) and RWLX assert turning on NRP0 and PRP0 respectively. Remember that the "X" indicates an active low signal. The assertion of RWL and RWLX allows the value of D_X to determine the value of the output signal read bit line (RBL) 101, which is also referred to herein as read data (RD). When RWL and RWLX deassert, RBL is set to high impedance to allow other SRAM cells to drive RBL when the other SRAM cells are selected to be read.

Figure 4:
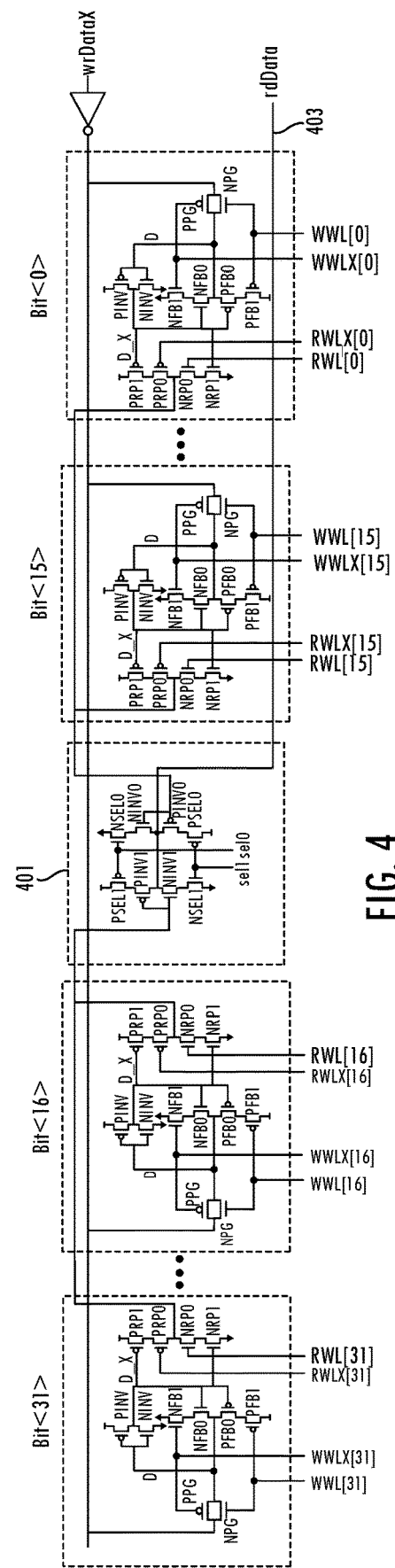
FIG. 4 illustrates a column of 32 latch bit cells.
Figure 5:
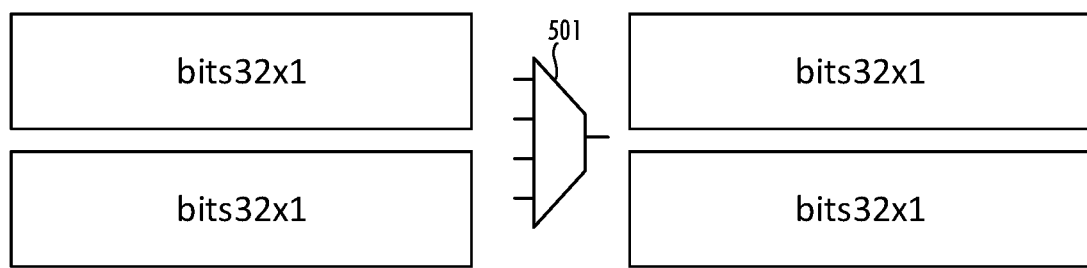
FIG. 5 illustrates a high level block diagram of two columns each with 64 rows of latch bit cells.

FIG. 4 illustrates an embodiment in which a group of 32 latch bit cells are formed in two groups of latch bit cells (bits <31:16> and bits <15:0>). Each group of latch bit cells supplies a bit to multiplexer 401, which selects a bit from either bits <31:16> or a bit from bits <15:0> and supplies the selected bit on rdData 403. In the embodiment of FIG. 4, the three state driver on the read side of the latch bit cells allows 16 bits (only one active at a time) to drive the same RBL supplied to multiplexer 401. Thus, only one RWL/RWLX is turned on at a time in each grouping [31:16] and [15:0] to ensure multiple latch bit cells not drive the RBL at the same time, which would cause a high current situation. It is also important to ensure that one of the RWL/RWLX signals is active causing one of the bit cells to drive a high or low logic level onto the RBL. All the RWL/RWLX pairs being deasserted would result in a floating node on RBL, which can cause high current draw in downstream CMOS gates receiving a signal mid-way between VDD and VSS FIG. 5 illustrates a block diagram of an embodiment having 64 rows of bit cells and two columns and a multiplexer 501 selects one bit from the 64 rows and two columns. While not shown in FIG. 5 for ease of illustration, the embodiment of shown in FIG. 5 requires a write column multiplexer function as well. One way to accomplish that is to supply a WWL/WWLX pair to even physical columns and another WWL/WWLX pair to odd physical columns. In that way every other cell can be written. Another way to accomplish the write multiplexer function is to use write masks as described further herein.

During write operations when the word line(s) for a particular word line are asserted, all the bits in the word line can change state. Rather than changing state of all the bits in the word line, it can be advantageous to only write selected cells of the word line, which helps make write operations more efficient. Accordingly, in another embodiment illustrated in FIG. 6, the latch bit cell 600 includes a write mask. The write mask utilizes the signals write one X (WRONEX), where "X" represents the signal is active low, and write zero (WRZERO). The write mask circuit is formed by transistors PWD 601 and NWD 603, where WD stands for write data. When WRONEX is asserted (active low), the write data (WD) node is pulled high through transistor PWD and when WRZERO is asserted, and the WD node is pulled low through transistor NWD. The write mask allows a write word line for a row of cells to be asserted without changing state in all of cells. For example, only a byte or a few bits on a word line can be changed by asserting the word line and using write masks to ensure only those cells of interest are written. In addition to the transistors PWD and NWD used to determine the value of WD, the write masked latch bit cell 600 includes transistors NFB2 and PFB2 used in the keeper circuit 605. Those transistors are used to make sure the feedback function of the keeper circuit continues to work so the latch bit cell maintains state even when WWL and WWLX are asserted. If WWLX is asserted, NFB1 turns off and if WWL is asserted PFB1 turns off. The transistors NFB2 and PFB2 ensure that if the bit has a write mask in effect blocking writing of the latch bit cell, the keeper circuit keeps driving "D" with the correct value from the node between NFB0 and PFB0 when WWL and WWLX are asserted. Note that WD will float when WRONEX and WRZERO are deasserted. By incorporating the PWD and NWD transistors into the bit cell itself, the capacitance on the intermediate node WD is kept low enough to avoid cell stability issues when WWL/WWLX are asserted. The keeper stack (KSTK) nodes PKSTK 602 and NKSTK 604 are labeled in FIG. 6.

Figure 6:
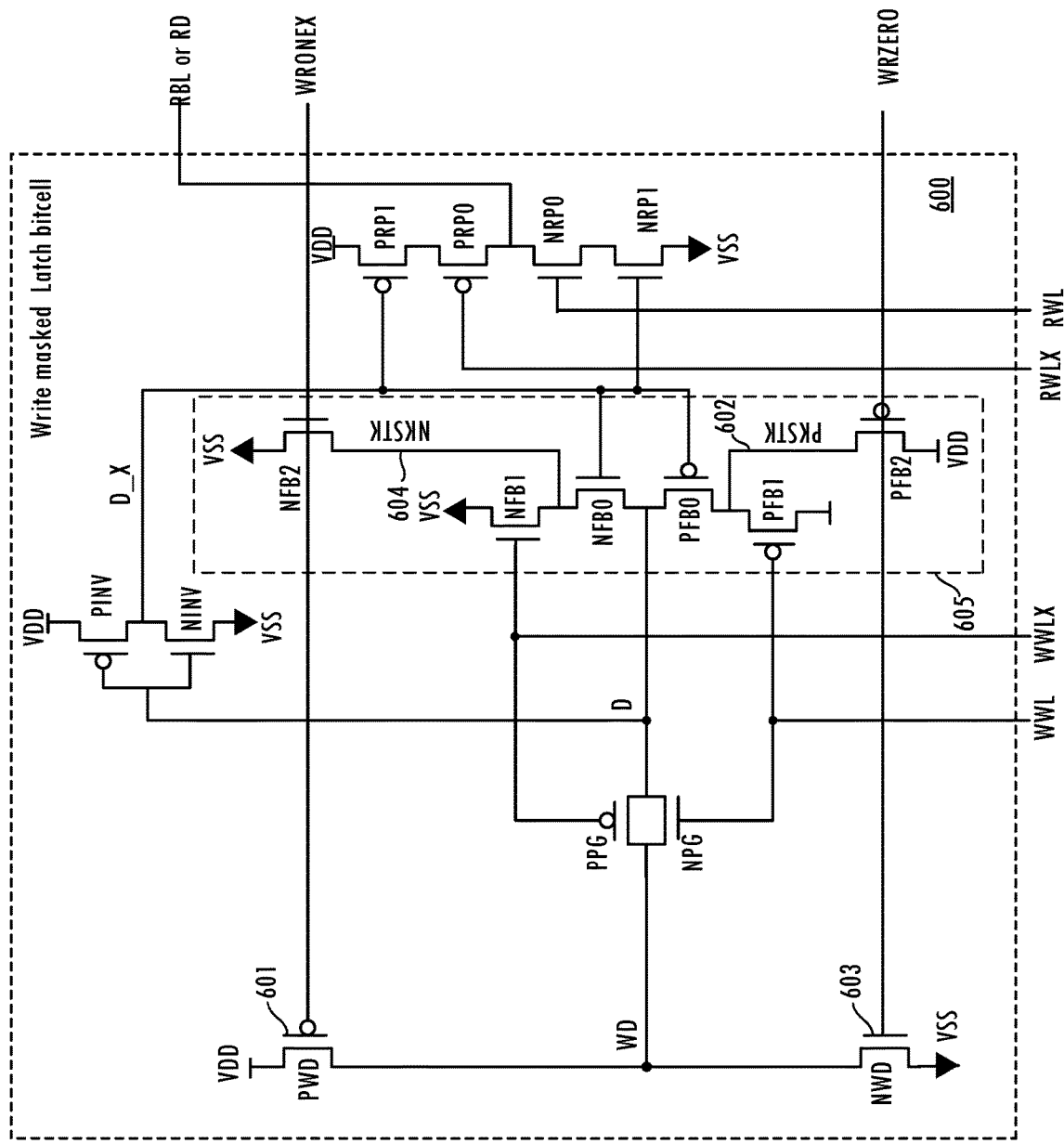
FIG. 6 illustrates an embodiment of a write masked latch bit cell.

FIG. 7 illustrates a stick figure of the layout of the write masked latch bit cell 600 shown in FIG. 6. Note that the solution of FIG. 6 increases the size of the cell by four transistors and includes an extra dummy cell as compared to the layout shown in FIG. 2. Thus, the write masked latch bit cell 600 (FIG. 6) shows an increase of 3 CPP to 10 CPP as compared to the layout of FIG. 2 (7 CPP) for latch bit cell 100 shown in FIG. 1.

Figure 8:
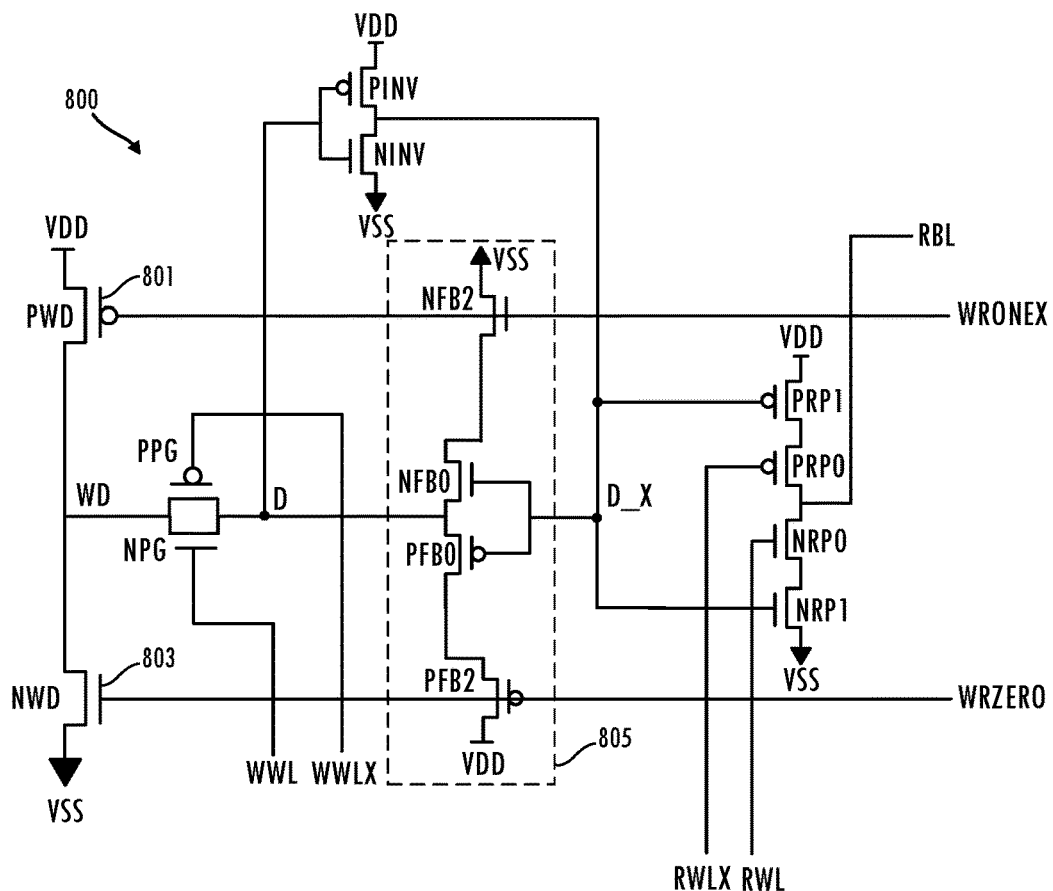
FIG. 8 illustrates another embodiment of a write masked latch bit cell.

FIG. 8 shows a more efficient embodiment of a write masked latch bit cell 800 as compared to the write masked latch bit cell 600 FIG. 6. Note that the extra transistors NFB2 and PFB2 coupled to keeper stack nodes in write masked latch bit cell 600 replace NFB1 and PFB1 in the write masked latch bit cell 800. The write masked latch bit cell 800 does not disable the keeper circuit 805 by turning off NFB1 and PFB1 when WWL and WWLX are asserted (see FIGS. 1 and 6) and instead, the write masked latch bit cell 800 only disables the keeper in response to WRONEX or WRZERO being asserted. That ensures the latch bit cell 800 holds state if the latch bit cell 800 is masked. Note that WWL and WWLX are coupled only to the pass gate transistors PPG and NPG in the write masked latch bit cell 800. When WRONEX is asserted (active low) transistor NFB2 turns off and when WRZERO is asserted transistor PFB2 turns off. Assuming WWLX and WWL are asserted, when WRONEX is asserted node WD goes high and node D goes high and when WRZERO is asserted (active low) node WD goes low and node D goes low. When the respective mask lines (WRONEX and WRZERO) are deasserted, both NFB2 and PFB2 are on and the keeper circuit maintains the value of node D according to the value of D_X provided by the inverter formed by transistors PINV and NINV. D_X turns on either transistor NFB0 to maintain a low value for node D or PFB0 to maintain a high value for node D. The write mask circuit is formed by transistors PWD 801 and NWD 803 and is similar to the embodiment illustrated in FIG. 6. The read side of the write masked latch bit cell 800 formed by transistors PRP1, PRP0, NRP0, and NRP1 is the same as in previous latch bit cell embodiments 100 and 600 shown in FIGS. 1 and 6, respectively.

Figure 9:
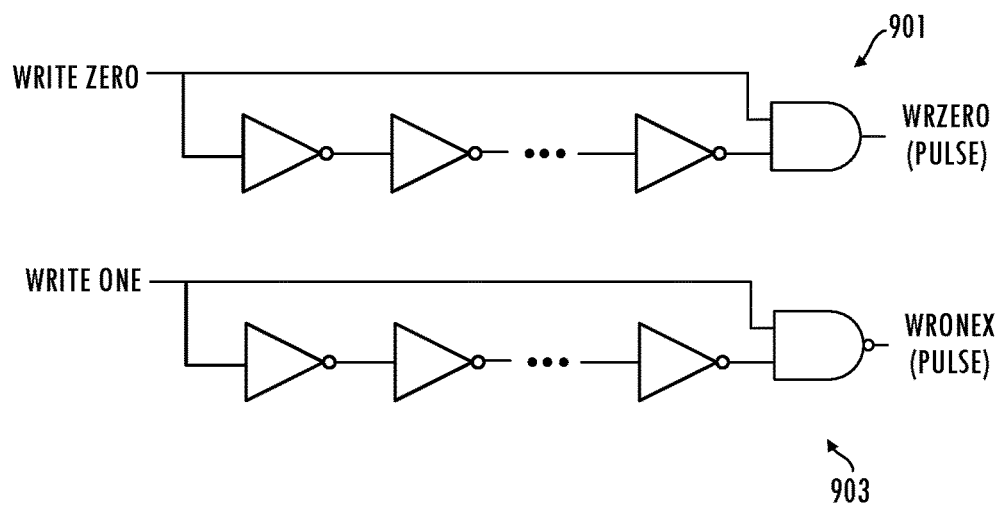
FIG. 9 illustrates an embodiment of a pulse generator to generate a WRZERO or a WRONEX pulse.

Whenever either WRONEX or WRZERO is asserted every bit cell in the column coupled to WRONEX and WRZERO will have their keeper circuit disabled since asserting WRONEX turns off NFB2 preventing D_X from being pulled to VSS through NFB0 and NFB2 and asserting WRZERO turns off PFB2 preventing D_X from being pulled to BDD through PFB0 and PBF2. Thus, node D will float responsive to the assertion of WRONEX or WRZERO. If the assertion of WRONEX or WRZERO is long enough, the cells along the column can change state since at least a portion of the keeper circuit is off due to NFB1 or PFB1 being disabled by the assertion of WRONEX or WRZERO. Therefore, WRONEX and WRZERO should be asserted as a pulsed write. Thus, those signals should be asserted as a self-timed pulse several inverter delays long, e.g., 50 ps. The pulse can be generated using, e.g., 9 inverters. The number of inverters depends on the technology being used. FIG. 9 shows an embodiment of pulse circuit 901 for WRZERO and pulse circuit 903 for WRONEX. Note that an odd number of inverters are used in each of the pulse circuits shown in FIG. 9. In FIG. 9, the inputs (WRITE ZERO and WRITE ONE) to the logic gates are assumed to be active high. Many other pulse generator circuits are known to those of skill in the art to provide a suitable pulse width for WRONEX and WRZERO. The pulse should be long enough to write the one cell but short enough that other cells along the column do not lose state due to node D floating during the pulse and thus there is a relatively small area penalty for the additional write mask capability as compared to the write masked latch bit cell shown in FIG. 6.

FIG. 10 shows an example layout for the circuit of FIG. 8. Note that only one dummy transistor is needed for the latch bit cell 800. The layout for latch bit cell 800 shown in FIG. 10 has only one extra CPP over the baseline latch bit cell 100 shown in FIG. 2.

FIG. 11 illustrates a latch array column of the latch shown in FIG. 1 formed in a single standard cell row. Note that the term "single standard cell row" refers to a physical row of an integrated circuit and not a logical row of the SRAM. In standard design with non-hybrid standard cell library rules all devices typically have the same number of fins. In traditional standard cell architecture all rows of devices have the same height. In the world of finfets, that generally means the same number of fins per finger as well. FIG. 12A illustrates a traditional standard cell architecture of PFETs and NFETs with 2 fins per finger. Each standard cell is uniform in the row and has a P and an N transistor.

Hybrid standard cell architectures utilize alternating rows of high performance and high density (but lower performance) standard cells. For example, in an embodiment that means two fins per transistor finger for the high performance cells and the lower performance cells have one fin per transistor finger. As shown in FIG. 12B, that results in alternating rows of taller and shorter cells and a shorter row. The advantage of hybrid standard cell architectures is smaller area and reduced power but the shorter cell height results in decreased performance compared to larger two fin cells. FIG. 12C illustrates an exemplary one fin per transistor finger device 1201 and a two fin per transistor finger device 1203.

Figure 13:
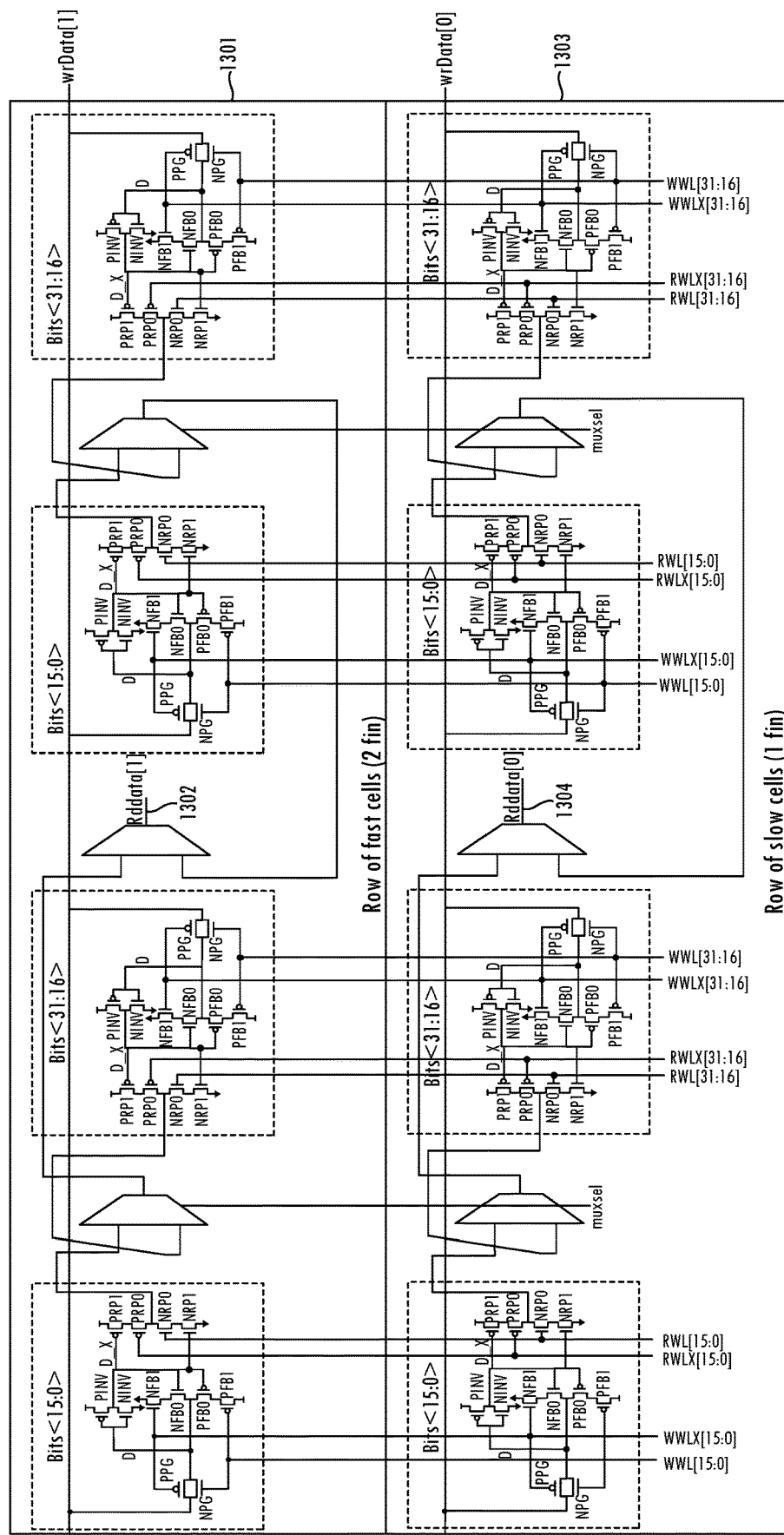
FIG. 13 illustrates an embodiment of a latch bit cell array utilizing a hybrid standard cell library.

FIG. 13 illustrates that moving from a traditional standard cell library to a hybrid standard cell library approach to building standard cell latch arrays can result in unbalanced performance between adjacent bits. For example, bit cells in column 1301 are formed of "fast" standard cells, e.g., with two fins per finger. The logical SRAM column 1301 is in a physical fast row of a hybrid row architecture in the illustrated embodiment. The bit cells in column 1303 are "slow" cells with, e.g., one fin per finger. Thus, reading Rddata[1] 1302 from one of the bit cells in column 1301 occurs faster than reading Rddata[0] 1304 from column 1302. Thus, adjacent bits are read with different timing (one fast and one slow), which is undesirable.

Figure 14:
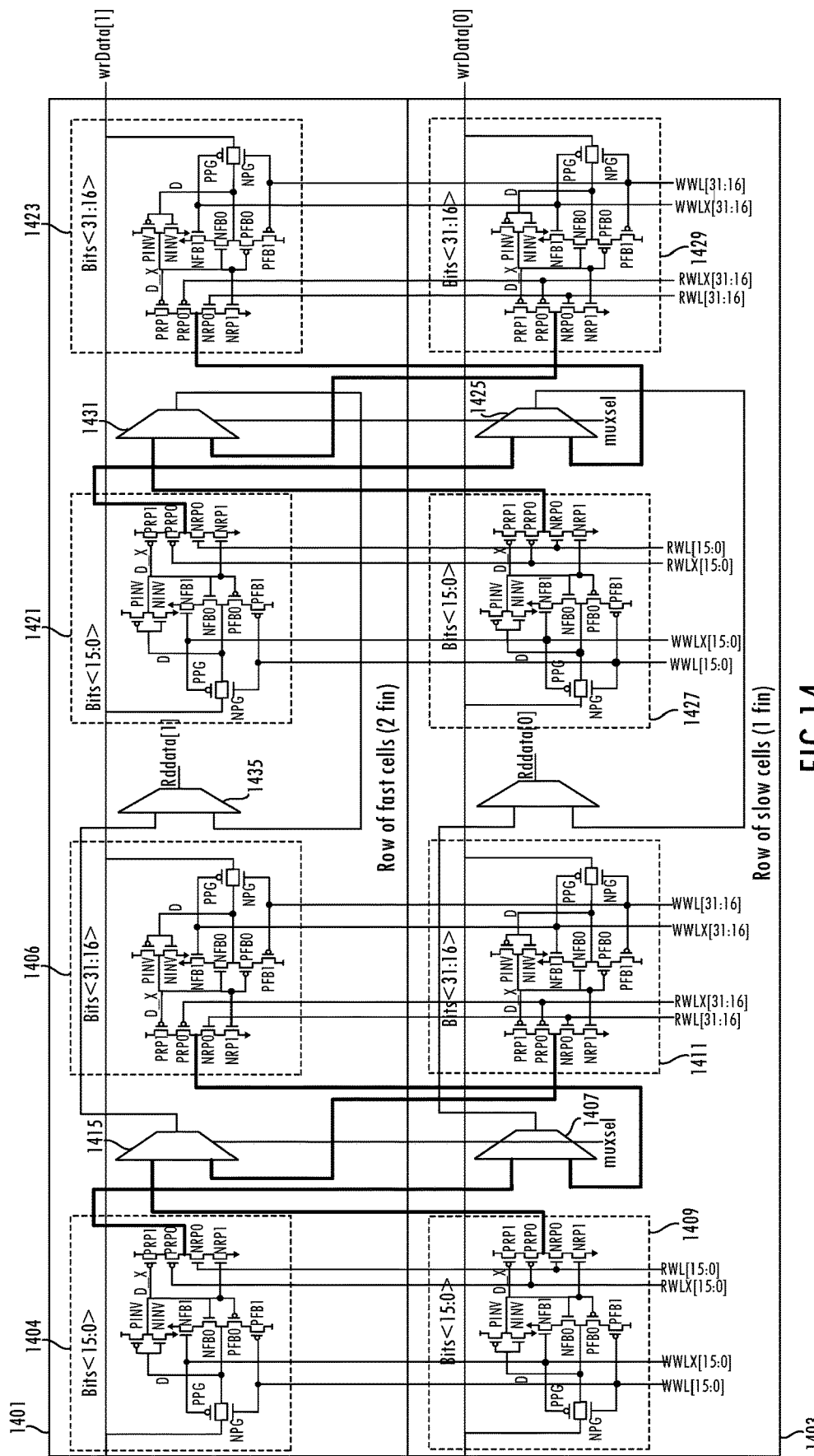
FIG. 14 illustrates an embodiment of a latch bit cell array utilizing a hybrid standard cell library that provides more balanced performance than the embodiment of FIG. 13.

In order to provide a more balanced performance between the fast and slow cells, the embodiment shown in FIG. 14 uses a group of the bit cells from one column, e.g., the bit cells in column 1401 (fast physical row) or 1403 (slow physical row), but uses the multiplexer circuits from the other row. For example, the slow multiplexer 1407 selects one bit from 32 fast bits cells. The 32 fast bit cells are fast bit cells 1404 (bits<15:0> only one of which is shown) and fast bits cells 1406 (bits<31:16> only one of which is shown). The fast multiplexer 1415 selects one bit from 32 slow bits cells. The 32 slow bit cells are slow bit cells 1409 (bits<15:0>) only one of which is shown) and slow bits cells 1411 (bits<31:16> only one of which is shown). Similarly fast bit cells 1421 and 1423 use slow multiplexer 1425 while slow bit cells 1427 and 1429 use fast multiplexer 1431. Read data (Rddata[1]) supplied by the fast multiplexer 1435 has fast multiplexers (2 fin) but slow bit cells (1 fin) and read data (Rddata[0]) has slow multiplexers (1 fin) but fast bit cells (2 fin). Thus, one logical SRAM column has fast bit cells and slow multiplexer stages while the adjacent SRAM logical column has slow bit cells and fast multiplexer stages. That provides an improved performance balance as compared to an array where every other bit has significantly different timing—fast and slow.

Figure 15:
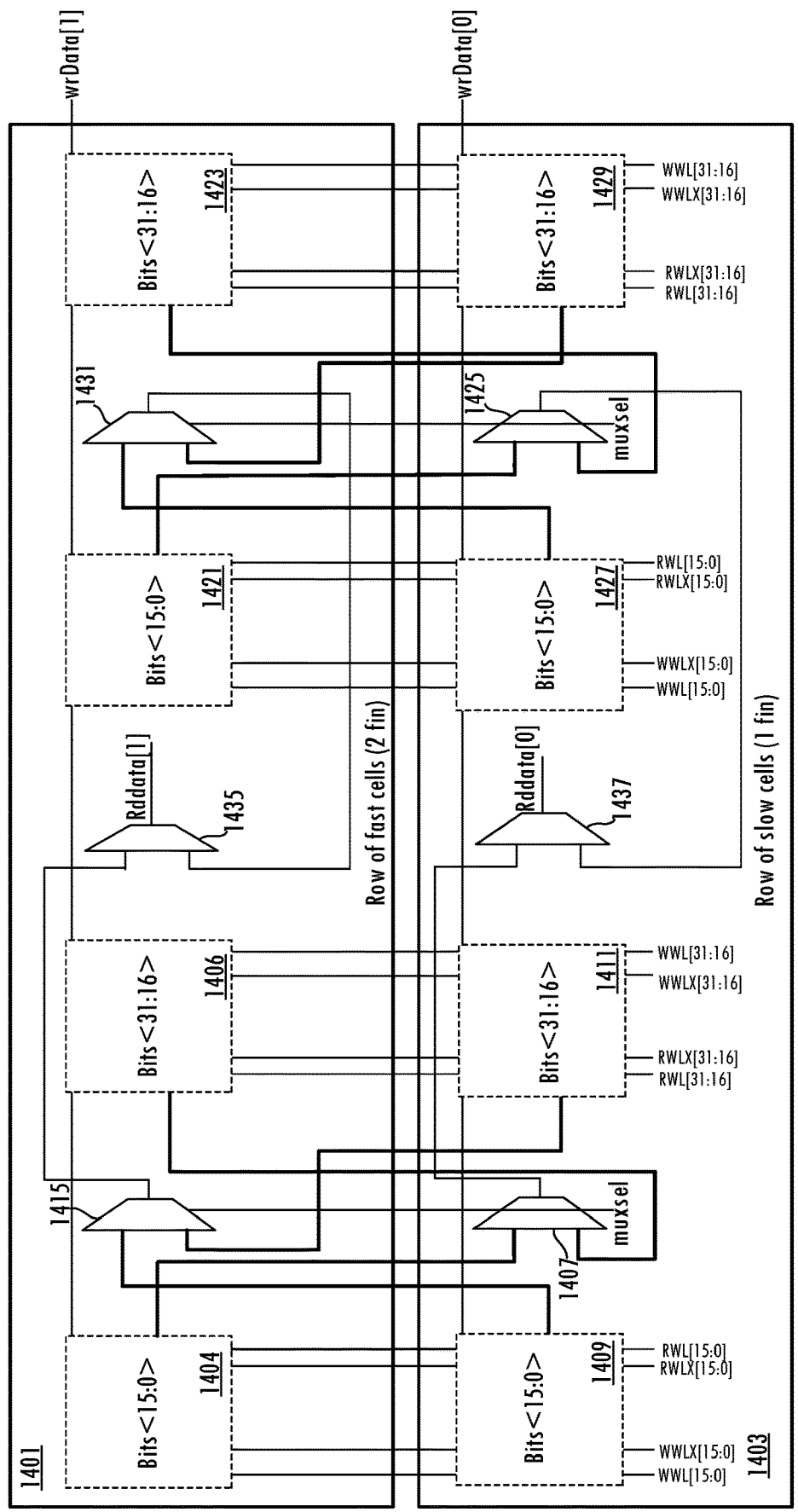
FIG. 15 illustrates a high level block diagram of an embodiment of a latch bit cell array.
Figure 16:
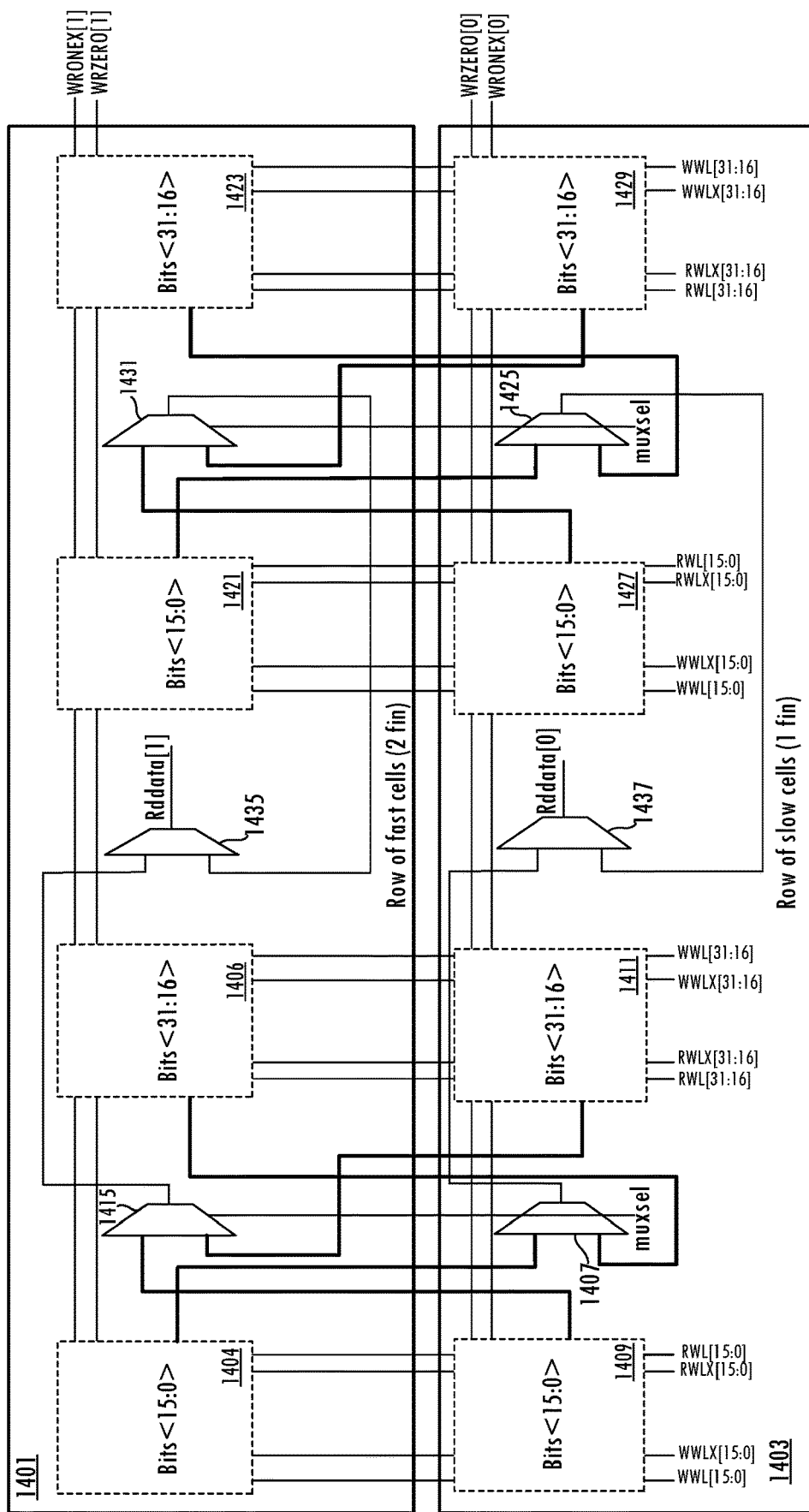
FIG. 16 illustrates a high level block diagram of an embodiment of a latch bit cell array using masked write bit cells.

FIG. 15 shows a higher level block diagram of an array of bit cells. While FIG. 14 shows the latch bit cell of FIG. 1 being utilized as the bit cells in the columns 1401 and 1403, in other embodiments other bit cells can be used. FIG. 16 illustrates an embodiment in which the masked write latch bit cell 600 of FIG. 6 or the masked write latch bit cell 800 of FIG. 8 is utilized. FIG. 16 shows the mask signals WRONEX and WRZERO signals being distributed to the bit cells.

Thus, a write masked SRAM bit cell has been described. The description of the invention set forth herein is illustrative and is not intended to limit the scope of the invention as set forth in the following claims. Variations and modifications of the embodiments disclosed herein, may be made based on the description set forth herein, without departing from the scope of the invention as set forth in the following claims.

What is claimed is:

1. An apparatus comprising:
    a write masked latch bit cell including a write portion of the write masked latch bit cell, the write portion including,
        a write mask circuit responsive to assertion of a first write mask signal to cause a value of a write data node to be a first value and responsive to assertion of a second write mask signal to cause the value of the write data node to have a second value;
        a pass gate coupled to the write data node, the pass gate to supply the value of the write data node to a first node responsive to write word line signals being asserted; and
        a keeper circuit configured to maintain a value of data on the first node independently of values of the write word line signals while the first write mask signal and the second write mask signal are deasserted.

2. The apparatus as recited in claim 1, wherein the write data node is floating responsive to the first write mask signal and the second write mask signal being deasserted.

3. The apparatus as recited in claim 2, wherein the write mask circuit further comprises:
    a first write data transistor coupled between a first power supply node and the write data node, the first write data transistor having a gate coupled to the first write mask signal; and
    a second write data transistor coupled between the write data node and a second power supply node, the second write data transistor having a gate coupled to the second write mask signal.

4. The apparatus as recited in claim 3, further comprising:
    an inverter coupled to the first node to supply inverted data; and
    wherein the keeper circuit further comprises:
        a keeper stack including a first keeper transistor, a second keeper transistor, a third keeper transistor, and a fourth keeper transistor;
        wherein the first keeper transistor has a first gate coupled to the first write mask signal, the first keeper transistor having first current carrying terminals being coupled between the second power supply node and the second keeper transistor;
        wherein the second keeper transistor has a second gate coupled to the inverted data, the second keeper transistor having second current carrying terminals being coupled between the first keeper transistor and the first node;
        wherein the third keeper transistor has a third gate coupled to the inverted data, the third keeper transistor having third current carrying terminals being coupled between the first node and the fourth keeper transistor; and
        wherein the fourth keeper transistor has a fourth gate coupled to the second write mask signal, the fourth keeper transistor having fourth current carrying terminals being coupled between the third keeper transistor and the first power supply node.

5. The apparatus as recited in claim 3, further comprising:
    an inverter coupled to the first node to supply inverted data; and
    wherein the keeper circuit further comprises:
        a keeper stack including a first keeper transistor, a second keeper transistor, a third keeper transistor, and a fourth keeper transistor;
        wherein the first keeper transistor has a first gate coupled to an active low write word line signal, the first keeper transistor having first current carrying terminals being coupled between the second power supply node and the second keeper transistor;
        wherein the second keeper transistor has a second gate coupled to the inverted data, the second keeper transistor having second current carrying terminals being coupled between the first keeper transistor and the first node;
        wherein the third keeper transistor has a third gate coupled to the inverted data, the third keeper transistor having third current carrying terminals being coupled between the first node and the fourth keeper transistor;
        wherein the fourth keeper transistor has a fourth gate coupled to a write word line signal, the fourth keeper transistor having fourth current carrying terminals being coupled between the third keeper transistor and the first power supply node; and wherein the write word line signals include the write word line signal and the active low write word line signal.

6. The apparatus as recited in claim 5, wherein the keeper circuit further comprises:
a fifth keeper transistor coupled between the second power supply node and a first keeper node between the first keeper transistor and the second keeper transistor, the fifth keeper transistor having a fifth gate coupled to the first write mask signal; and
a sixth keeper transistor coupled between the first power supply node and a second keeper node between the third keeper transistor and the fourth keeper transistor, the sixth keeper transistor having a sixth gate coupled to the second write mask signal.

7. The apparatus as recited in claim 1, further comprising:
a first pulse generator to generate the first write mask signal; and
a second pulse generator to generate the second write mask signal.

8. The apparatus as recited in claim 1 further comprising:
a read portion of the write masked latch bit cell coupled to receive read word line signals and responsive to assertion of the read word line signals to supply output data on an output node of the read portion of the write masked latch bit cell, the output data corresponding to the data on the first node.

9. The apparatus as recited in claim 8, wherein the read portion of the write masked latch bit cell is configured to cause the output node to be high impedance responsive to the read word line signals being deasserted.

10. A method comprising:
setting a write data node in a write masked latch bit cell to a first value responsive to assertion of a first write mask signal;
setting the write data node to a second value responsive to assertion of a second write mask signal;
coupling the write data node to a first node responsive to write word line signals being asserted; and
maintaining the data on the first node independently of values of the write word line signals using a keeper circuit while the first write mask signal and the second write mask signal are deasserted.

11. The method as recited in claim 10, further comprising:
causing the write data node to float responsive to the first write mask signal and the second write mask signal being deasserted.

12. The method as recited in claim 10, further comprising:
supplying a gate of a first write data transistor with the first write mask signal;
setting the write data node to the first value by coupling a first power supply node to the first node through the first write data transistor responsive to the assertion of the first write mask signal;
supplying a gate of a second write data transistor with the second write mask signal; and
setting the write data node to the second value by coupling a second power supply node to the first node through the second write data transistor responsive to the assertion of the second write mask signal.

13. The method as recited in claim 10, further comprising:
inverting the data on the first node and supplying inverted data to the keeper circuit;

enabling the keeper circuit responsive to the first write mask signal and the second write mask signal being deasserted; and
disabling the keeper circuit responsive to the first write mask signal and the second write mask signal being asserted.

14. The method as recited in claim 13, further comprising:
supplying the first write mask signal to a first gate of a first keeper transistor and enabling the first keeper transistor responsive to the first write mask signal being deasserted;
suppling the inverted data to a second gate of a second keeper transistor;
suppling the inverted data to a third gate of a third keeper transistor; and
supplying the second write mask signal to a fourth gate of a fourth keeper transistor and enabling the fourth keeper transistor responsive to the second write mask signal being deasserted.

15. The method as recited in claim 13, further comprising:
supplying an active low write word line signal to a first gate of a first keeper transistor;
suppling the inverted data to a second gate of a second keeper transistor;
suppling the inverted data to a third gate of a third keeper transistor;
supplying a write word line signal to a fourth gate of a fourth keeper transistor, the write word line signals including the write word line signal and the active low write word line signal;
supplying the first write mask signal to a first gate of a fifth keeper transistor and enabling the fifth keeper transistor responsive to the first write mask signal being deasserted; and
supplying the second write mask signal to a sixth gate of a sixth keeper transistor and enabling the sixth keeper transistor responsive to the second write mask signal being deasserted.

16. The method as recited in claim 10, further comprising:
generating the first write mask signal as a first pulse; and
generating the second write mask signal as a second pulse.

17. The method as recited in claim 16,
wherein the first pulse is short enough to keep the data on the first node from changing state when first pulse write mask signal is asserted and the write word line signals are not asserted.

18. The method as recited in claim 16,
wherein the second pulse is short enough to keep the data on the first node from changing state when first pulse write mask signal is asserted and the write word line signals are not asserted.

19. The method as recited in claim 10 further comprising:
supplying output data on an output node of a read portion of the write masked latch bit cell responsive to read word line signals being asserted; and
causing the output node to be high impedance responsive to the read word line signals being deasserted.

20. A method comprising:
writing a write masked latch bit cell responsive to a write word line (WWL) signal and an active low write word line (WWLX) signal being asserted in combination with either a first write mask signal or a second write mask signal being asserted; and
maintaining a state of the write masked latch bit cell while the WWL signal and WWLX signal are asserted and the first write mask signal and the second write mask signal are deasserted.

* * * * *